United States Patent
Sakai (10) Patent No.: US 7,417,186 B2
(45) Date of Patent: Aug. 26, 2008

(54) THERMOELECTRIC CONVERSION MATERIAL, THERMOELECTRIC CONVERSION ELEMENT USING THE SAME, AND ELECTRONIC APPARATUS AND COOLING DEVICE COMPRISING THE ELEMENT

(75) Inventor: Akihiro Sakai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 13 days.

(21) Appl. No.: 11/508,839

(22) Filed: Aug. 24, 2006

(65) Prior Publication Data

US 2006/0283494 A1 Dec. 21, 2006

Related U.S. Application Data

(63) Continuation of application No. PCT/JP2006/309513, filed on May 11, 2006.

(30) Foreign Application Priority Data

May 30, 2005 (JP) ............................. 2005-156780

(51) Int. Cl.
H01L 35/22 (2006.01)
(52) U.S. Cl. ................ 136/238; 136/236.1; 252/62.3 T
(58) Field of Classification Search .............. 136/236.1, 136/238; 252/62.3 T
See application file for complete search history.

(56) References Cited

U.S. PATENT DOCUMENTS

2004/0261833 A1 12/2004 Ono et al.
2007/0039641 A1* 2/2007 Hu et al. ..................... 136/238

FOREIGN PATENT DOCUMENTS

| JP | 8-186294 A | 7/1996 |
|---|---|---|
| JP | 9-321346 A | 12/1997 |
| JP | 2002-84006 A | 3/2002 |
| JP | 2003-218411 A | 7/2003 |
| JP | 2005-64407 A | 3/2005 |
| WO | WO 03/085747 A2 | 10/2003 |
| WO | WO 2004/095594 A1 | 11/2004 |

OTHER PUBLICATIONS

D. Pelloquin, "Partial Substitution of rhodium for cobalt in the misfit $[Pb_{0.7}C_{0.4}Sr_{1.9}O_3]^{KS}$ $[CoO_2]_{1.8}$ oxide", Journal of Solid State Chemistry, 2005, p. 769-775.

* cited by examiner

Primary Examiner—Kaj K. Olsen
Assistant Examiner—Jeffrey T. Barton
(74) Attorney, Agent, or Firm—McDermott Will & Emery LLP (57) ABSTRACT

To provide a thermoelectric conversion material having semiconductor-like temperature dependence, that is, the property that electric resistivity decreases with increasing temperature, and having high thermoelectric performance. The present invention is a thermoelectric conversion material including a semiconductor phase having a layered bronze structure expressed by a formula of $A_y(Co_{1-x}Rh_x)O_2$, where A is an alkaline-earth metal, y is 0.2 to 0.8, and x is 0.4 to 0.6.

8 Claims, 7 Drawing Sheets

THERMOELECTRIC CONVERSION MATERIAL, THERMOELECTRIC CONVERSION ELEMENT USING THE SAME, AND ELECTRONIC APPARATUS AND COOLING DEVICE COMPRISING THE ELEMENT

RELATED APPLICATIONS

This application is a continuation of International Application No. PCT/JP2006/309513, filed on May 11, 2006, which in turn claims the benefit of Japanese Application No. 2005-156780, filed on May 30, 2005, the disclosures of which Applications are incorporated by reference herein.

BACKGROUND OF THE INVENTION

1. Field of the Invention

The present invention relates to a thermoelectric conversion material for performing energy conversion between electric energy and thermal energy, using thermoelectric effect, and a thermoelectric conversion element using the material. The present invention also relates to an electronic apparatus using thermoelectric generation induced by the material and a cooling device using thermoelectric cooling induced by the material.

2. Description of the Related Art

Thermoelectric generation is a technology for directly converting thermal energy into electric energy by Seebeck effect, a phenomenon in which a temperature difference in opposite ends of a substance causes thermal electromotive force proportional to the temperature difference. This electric energy can be used as electric power when a load is connected thereto and a closed circuit is constituted. This technology has found practical applications in power sources for remote areas, for space, for military use, and the like.

Thermoelectric cooling is a technology for causing heat absorption by Peltier effect, a phenomenon in which application of an electric current through a circuit made of different substances connected to each other causes heat absorption in one junction and heat generation in the other junction. This effect is thought to be derived from the characteristic that the ratio between the electric current carried by electrons and a heat current carried thereby differs between the substances when two kinds of substances each of which is different in carrier polarity, a p-type semiconductor and an n-type semiconductor, for example, are thermally connected in parallel and electrically connected in series, and the electric current is applied therebetween. The thermoelectric cooling technology has found practical application in local cooling devices such as for cooling electronic devices in a space station, and wine coolers.

To date, desired is a thermoelectric conversion material exhibiting a good thermoelectric conversion characteristic (thermoelectric performance) in a wide range of temperatures from room temperature to high temperature. Various materials, most of which are semiconductors, are under consideration.

The thermoelectric performance is generally evaluated by a figure of merit Z, or a figure of merit ZT that is made dimensionless by multiplying Z by absolute temperature T. ZT can be expressed as $ZT=S^2/\rho\kappa$, where S is a Seebeck coefficient, $\rho$ is electric resistivity, and $\kappa$ is thermal conductivity. That is, in order to allow the thermoelectric conversion material to exhibit excellent thermoelectric performance, large thermal electromotive force, small thermal conductivity, and small electric resistivity are desired. In the conventional thermoelectric conversion materials, however, it can not be said that sufficient ZT is obtained. This is because S, $\rho$, and $\kappa$ are basically functions of carrier density, and thus, difficult to vary independently, which gives rises to difficulties in finding the appropriate solution.

The thermoelectric conversion materials developed until today include a $Bi_2Te_3$-based semiconductor. With this material, thermoelectric performance on a practical level at room temperature can be obtained. In addition, there have been developments toward the practical application on materials having a complicated structure such as a Skutterudite compound, and a clathrate compound.

JP 8(1996)-186294 A (reference 1) discloses a thermoelectric conversion material expressed by a formula of $Co_{1-x}M_xSb_3$ (x is 0.001 to 0.2 in the reference 1) in which one portion of Co, which is an element constituting a $CoSb_3$ compound having a Skutterudite structure, is substituted with at least one element M selected from Pd, Rh, and Ru. The thermoelectric conversion material disclosed in the reference 1, however, has a problem in that in a high-temperature range, the thermoelectric performance of the material deteriorates due to oxidization.

JP 9(1997)-321346 A (reference 2), JP 2003-218411 A (reference 3), and WO03/085747 (reference 4) disclose a thermoelectric conversion material referred to as a so-called "$AMO_2$-type oxide" (in the references 2 to 4, A is an alkali metal or an alkaline-earth metal, and M is Co). These materials do not easily suffer from damage or oxidization even under a high-temperature environment, and exhibit excellent thermoelectric performance. The thermoelectric conversion material disclosed in the references 2 to 4 are materials having a so-called "layered bronze structure" described later. It is well known that an $AMO_2$-type crystal, typical of the layered bronze structure, has metallic properties, that is, the property that the electric resistivity increases with increasing temperature.

WO2004/095594 (reference 5) discloses a thermoelectric conversion material including a Half-Heusler alloy expressed by a formula of $QR(L_{1-p}Z_p)$ (in the reference 5, Q is a group 5 element, R is at least one element selected from Co, Rh and Ir, and p is 0 (zero) or more, and less than 0.5).

JP 2005-64407 A (reference 6) discloses a thermoelectric conversion material expressed by a formula of $Sr_xRh_2O_y$ (in the reference 6, x is 0.7 to 1.0, and y is 4.0 or more), and describes that the electric resistivity of the material exhibits the above-described metallic property (see paragraph number [0020], for example).

The thermoelectric performance of these thermoelectric conversion materials, however, is not yet satisfactory, and is lower than that of the $Bi_2Te_3$-based semiconductor that has entered a practical stage. This calls for further improvement of the thermoelectric performance. In addition, while it is expected that the thermoelectric generation in a temperature range higher than conventional produces a greater electric energy, the thermoelectric conversion material exhibiting metallic properties increases the electric resistivity of the material with increasing temperature, thereby resulting in a larger loss.

SUMMARY OF THE INVENTION

Unlike those conventional thermoelectric conversion materials, it is an object of the present invention to provide a thermoelectric conversion material having semiconductor-like properties, that is, the property that electric resistivity decreases with increasing temperature and having high thermoelectric performance.

The inventors, through keen examinations, completed the present invention by finding out that the semiconductor-like property was exhibited by introducing, based on an $AMO_2$-type oxide having a layered bronze structure, a thermoelectric conversion material having Co included as M substituted with Rh at a particular ratio.

A thermoelectric conversion material of the present invention is a material including a semiconducting phase having a layered bronze structure expressed by a formula of $A_y(Co_{1-x}Rh_x)O_2$, where A is an alkaline-earth metal, y is 0.2 to 0.8, and x is 0.4 to 0.6.

The thermoelectric conversion material of the present invention has the property that the electric resistivity decreases with increasing temperature, so that it is possible to suppress a loss caused by the electric resistivity that the material itself has, in a wide range of temperatures, and particularly in a high temperature range. That is, the thermoelectric conversion material of the present invention can, compared to the conventional thermoelectric conversion material, improve the thermoelectric performance in a wide range of temperatures, in particular, at high temperature, thereby allowing a practical application.

The thermoelectric conversion material of the present invention can be used as a thermoelectric conversion element comprising the material and electrodes electrically connected to the material, for example. This element can be the thermoelectric conversion element comprising the thermal conversion material of the present invention and a pair of electrodes electrically connected to the material, for example.

The thermoelectric conversion element of the present invention can be used as an electronic apparatus using the thermoelectric generation or a cooling device using the thermoelectric cooling, for example. This electronic apparatus can be an electronic apparatus comprising the thermoelectric conversion element of the present invention, and a load electrically connected to the element and operated by electric power supplied from the element, for example. This cooling device can be a cooling device comprising the thermoelectric conversion element of the present invention, and a power source electrically connected to the element, for example.

DETAILED DESCRIPTION OF THE PREFERRED EMBODIMENTS

The references 1 to 6 do not disclose or suggest the thermoelectric conversion material of the present invention. Accordingly, a thermoelectric conversion material of the present invention affords novelty and inventiveness over each of these references.

The reference 1 discloses a technology in which one portion of Co is substituted with Rh in a thermoelectric conversion material. The thermoelectric conversion material disclosed in the reference 1, however, is not an $AMO_2$-type oxide, and the range in which Co is substituted with Rh (marked with x in the reference 1 and in this specification) is 0.001 to 0.2. This indicates that the thermoelectric conversion material disclosed in the reference 1 is fundamentally different from that of the present invention, which is the $AMO_2$-type oxide. The range in which Co is substituted with Rh is also completely different between the reference 1 and the present invention. In the present invention, the range x is 0.4 to 0.6. Furthermore, the reference 1 does not disclose or suggest that this substitution results in the thermoelectric conversion material exhibiting semiconductor-like properties, not metallic properties.

Accordingly, even when the references 2 to 4 disclosing the thermoelectric conversion material having the layered bronze structure and the reference 1 disclosing that one portion of Co is substituted with Rh in the thermoelectric conversion material are combined, it is quite difficult to lead to the present invention, that is, the range of x is 0.4 to 0.6, so that semiconductor-like properties, not metallic properties, are exhibited.

In the thermoelectric conversion material of the present invention, an element A can be at least one element selected from calcium (Ca) and strontium (Sr).

The thermoelectric conversion material of the present invention can be made of a crystal expressed by a formula of $A_y(Co_{1-x}Rh_x)O_2$.

In the thermoelectric conversion material of the present invention, a temperature derivative (dρ/dT) of electric resistivity (volume resistivity) at 300° C. can be negative.

In the thermoelectric conversion material of the present invention, the temperature derivative (dρ/dT) at 300° C. can be −0.006 or less.

Figure 1:
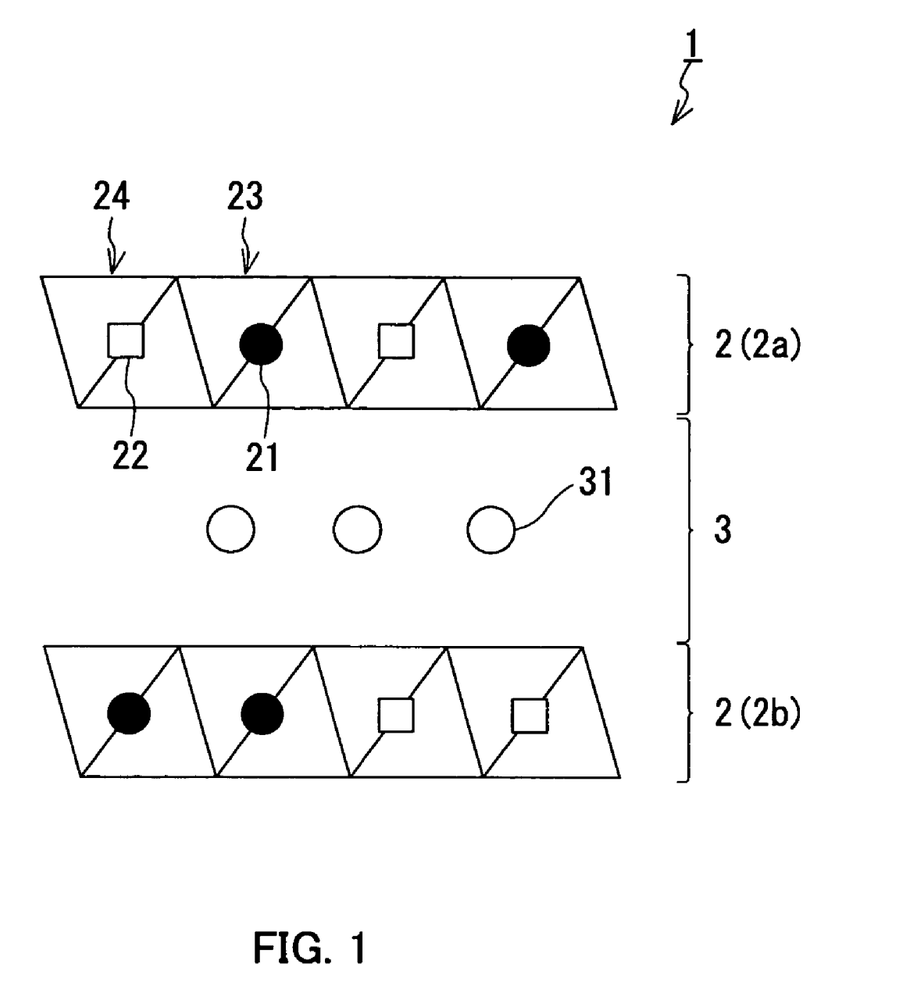
FIG. 1 is a schematic view of a structure of a thermoelectric conversion material of the present invention.

FIG. 1 schematically depicts a structure of a thermoelectric conversion material of the present invention. A thermoelectric conversion material 1 has a so-called layered bronze structure, which is a crystalline structure, comprising an electric conductive layer 2 constituting of a two-dimensionally aligned $MO_2$ octahedron in which the ridges are shared, and an electric insulating layer 3 constituting of an element A. The electric conductive layer 2 and the electric insulating layer 3 are alternately stacked in a vertical direction relative to each layer.

In the thermoelectric conversion material 1, the electric conductive layer 2 includes Co 21 indicated by a black circle in FIG. 1 and Rh 22 indicated by a square in FIG. 1, as an element M. Co 21 constitutes a $CoO_2$ octahedron 23, and Rh 22 constitutes an $RhO_2$ octahedron 24, respectively. The electric conductive layer 2 is constituted of the $CoO_2$ octahedrons 23 and the $RhO_2$ octahedrons 24.

Arrangement of Co 21 and Rh 22 (arrangement of the $CoO_2$ octahedrons 23 and the $RhO_2$ octahedrons 24) in the electric conductive layer 2 is not particularly limited. For example, as an electric conductive layer 2a shows, the $CoO_2$ octahedrons 23 and the $RhO_2$ octahedrons 24 can be arranged one after another, and as an electric conductive layer 2b shows, the both octahedrons can be arranged so that the $CoO_2$ octahedrons 23 are next to each other, or the $RhO_2$ octahedrons 24 are next to each other. In other words, the $CoO_2$ octahedrons 23 and the $RhO_2$ octahedrons 24 are mixed in the electric conductive layer 2.

Regarding the ratio of Rh to Co in the thermoelectric conversion material 1, an atomic fraction of Rh relative to the sum of Co and Rh is 0.4 to 0.6. In other words, in the whole thermoelectric conversion material 1, the electric conductive layer 2 may include 40 to 60% of the $RhO_2$ octahedrons 24 relative to the whole $MO_2$ octahedrons, and 60 to 40% of the $CoO_2$ octahedrons 23 relative to the whole $MO_2$ octahedrons.

In the thermoelectric conversion material 1, the electric insulating layer 3 is constituted of one layer formed of elements A 31 indicated by a white circle in FIG. 1.

Such thermoelectric conversion material 1 has semiconductor-like temperature dependence, more specifically, the property that electric resistivity decreases with increasing temperature, and is capable of suppressing a loss caused by the electric resistivity that the material itself has in a wide range of temperatures, in particular, at high temperature. That is, the thermoelectric conversion material 1 can improve thermoelectric performance in a wide range of temperatures, in particular, at high temperature, compared to the conventional thermoelectric conversion materials. Because of these properties, the thermoelectric conversion material 1 can find practical application.

Figure 2A:
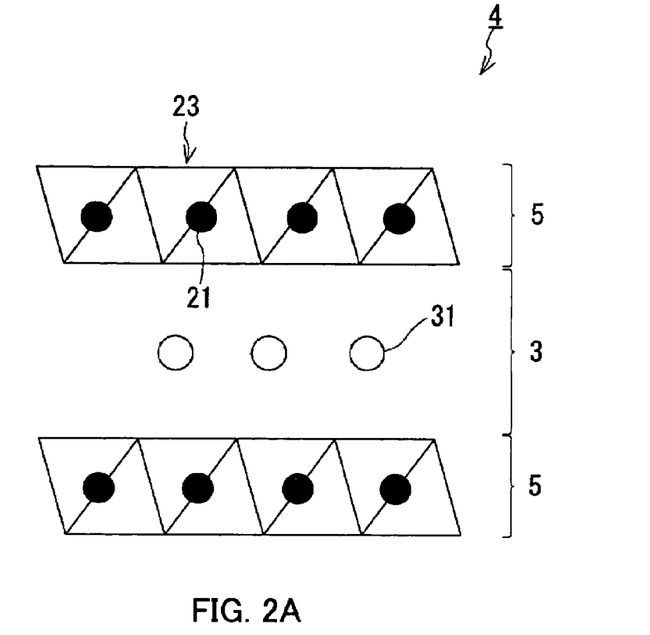
FIG. 2A is a schematic view of a structure of $A_yCoO_2$, which is the conventional thermoelectric conversion material.
Figure 2B:
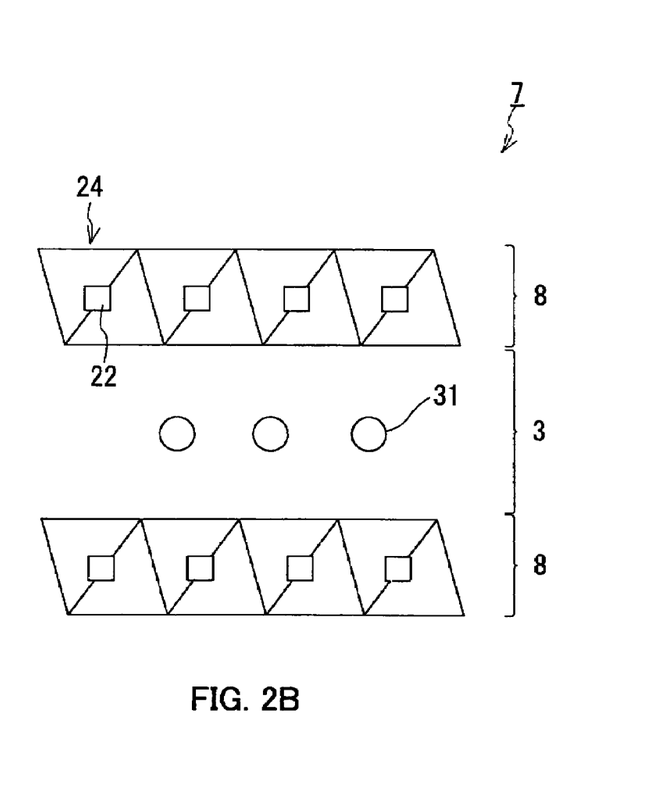
FIG. 2B is a schematic view of a structure of $A_yRhO_2$, which is the conventional thermoelectric conversion material.

A structure of $A_yCoO_2$, and that of $A_yRhO_2$, both of which are conventional thermoelectric conversion materials formed of an $AMO_2$-type oxide, are schematically depicted in FIGS. 2A, 2B, respectively. Thermoelectric conversion materials 4, 7 shown in FIGS. 2A, 2B, similar to the thermoelectric conversion material 1 of the present invention, have layered bronze structures in which electric conductive layers (indicated by a numeral 5 in an example shown in FIG. 2A, a numeral 8 in an example shown in FIG. 2B) and electric insulating layers 3 are alternately stacked in a vertical direction relative to each layer.

In the thermoelectric conversion material 4 shown in FIG. 2A, the electric conductive layer 5 consists of Co 21, as an element M, and consists of a $CoO_2$ octahedron 23. In the thermoelectric conversion material 7 shown in FIG. 2B, the electric conductive layer 8 consists of Rh 22 as the element M, and consists of a $RhO_2$ octahedron 24. The electric insulating layers 3 shown in FIG. 2A, 2B are similar to the electric insulating layer 3 shown in FIG. 1.

The $AMO_2$-type oxide in which the M consists of Co (FIG. 2A), and the $AMO_2$-type oxide in which the M consists of Rh (FIG. 2B) have metallic temperature dependence, that is, the electric resistivity of it increases with increasing temperature.

Figure 3:
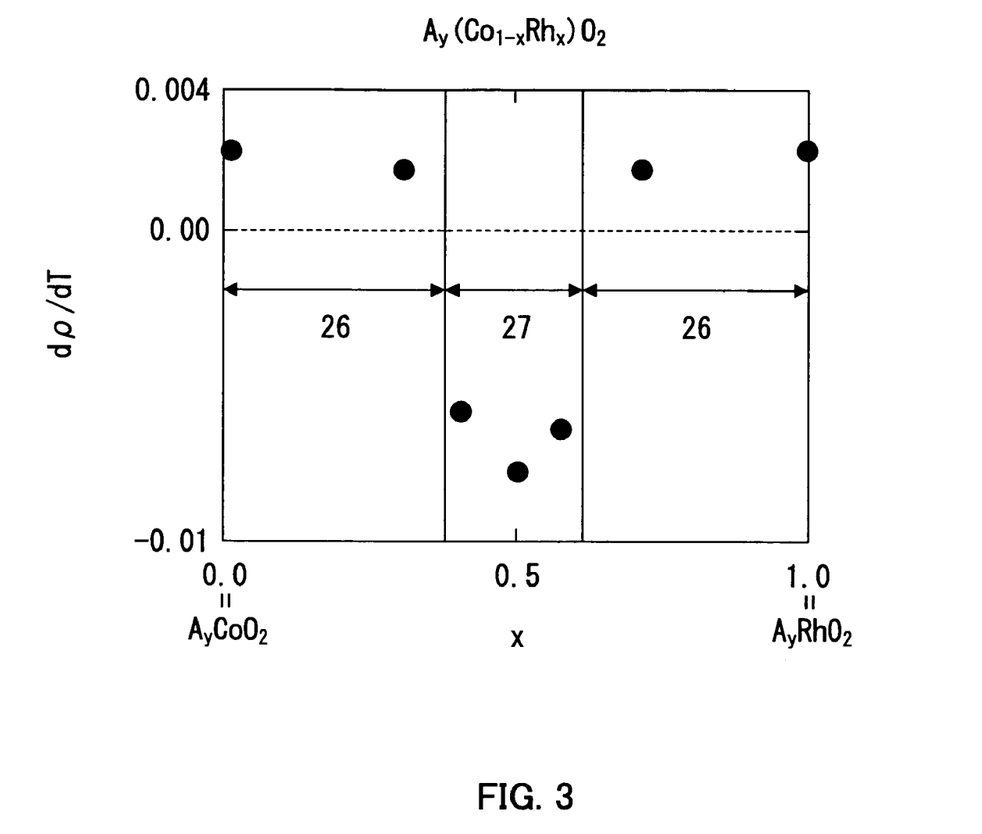
FIG. 3 is a view showing a relationship between an atomic fraction x of Rh relative to the sum of Co and Rh, and a temperature derivative (dρ/dT) of electric resistivity in a thermoelectric conversion material expressed by a formula of $A_y(Co_{1-x}Rh_x)O_2$.

The inventors of the present invention manufactured seven kinds of $AMO_2$-type oxides expressed by a formula of $A_y(Co_{1-x}Rh_x)O_2$ while x values were varied (x=0.0, 0.3, 0.4, 0.5, 0.6, 0.7, and 1.0), and evaluated temperature derivatives (dρ/dT) of the electric resistivity at around 300° C. as temperature dependence of the electric resistivity in the respective oxides. The evaluation results are shown in FIG. 3 and the below Table 1. It is noted that strontium (Sr) was used as the element A, the y value is 0.6. At around 300° C., dρ/dT of each oxide was evaluated by mathematically calculating the variance of the electric resistivity at around 300° C. after evaluating each oxide (thermoelectric conversion material) for the temperature dependence of the electrical resistivity. The evaluation methods of the dependence will be described in Examples.

TABLE 1

| X | dρ/dT |
|---|---|
| 0.0 | 0.0025 |
| 0.3 | 0.0020 |
| 0.4 | −0.0060 |
| 0.5 | −0.0080 |
| 0.6 | −0.0065 |
| 0.7 | 0.0020 |
| 1.0 | 0.0025 |

As FIG. 3 and Table 1 show, when the element M was Co (x=0.0), and when the element M was Rh (x=1.0), that is, when the oxide is $A_yCoO_2$ and $A_yRhO_2$, a value of dρ/dT was positive (0.0025), revealing a metallic temperature dependence of the electric resistivity. When x was 0.3 and 0.7, the value of dρ/dT was similarly positive (0.0020), revealing a metallic temperature dependence of the electric resistivity.

To the contrary, when x was in the range of 0.4 to 0.6, the value of dρ/dT was negative (more specifically, −0.0060 or less), revealing a semiconductor-like temperature dependence of the electric resistivity. That is, it was found that in the $AMO_2$-type oxide expressed by the formula of $A_y(Co_{1-x}Rh_x)O_2$, when M was Co and Rh, and the atom fraction of Rh relative to the sum of Co and Rh was 0.4 to 0.6, a completely new electron phase (semiconductor phase 27 shown in FIG. 3) having the semiconductor-like properties was exhibited, which was different from the conventional metallic phase (metallic phases 26 shown in FIG. 3).

While the thermoelectric conversion material of the present invention can include components other than the semiconductor-like phase having the above-described layered bronze structure, e.g., elements not constituting the above-described layered bronze structure, the thermoelectric conversion material is preferably formed of the above-described layered bronze structure, that is, the thermoelectric conversion material formed of the crystal expressed by the above formula of $A_y(Co_{1-x}Rh_x)O_2$ because a higher thermoelectric characteristic can be obtained.

The semiconductor phase having the above layered bronze structure in the thermoelectric conversion material of the present invention can be either single-crystalline or polycrystalline. Generally, the single-crystalline results in the higher thermoelectric characteristic, and the polycrystalline results in improving on mass-production of the thermoelectric conversion materials.

In the thermoelectric conversion material of the present invention, the element A is not limited as long as it is at least one element selected from alkaline-earth metals. For example, at least one element selected from Ca and Sr. In this case, a thermoelectric conversion material of greater stability can be manufactured.

The value y corresponding to a content of the element A in the thermoelectric conversion material of the present invention is generally in the range of about 0.2 to 0.8.

A content of O (oxygen) in the thermoelectric conversion material of the present invention is very difficult to exactly define because the dependence of a manufacturing method of the material, for example, is large. Generally, the content of oxygen in the thermoelectric conversion material of the present invention is expected to be in a rough range of $1.5 \leq z \leq 2.5$ in a formula of $A_y(Co_{1-x}Rh_x)O_z$. That is, the value of "2" in the formula of $A_y(Co_{1-x}Rh_x)O_2$ is not exactly "2", and generally, this value is in a rough range of 1.5 to 2.5. In other words, the thermoelectric conversion material of the present invention includes a semiconductor phase having a layered bronze structure expressed by a formula of $A_y(Co_{1-x}Rh_x)O_z$ ($1.5 \leq z \leq 2.5$).

The thermoelectric conversion material of the present invention can include elements other than the element A, Co, Rh, and O. For example, alkali metal elements such as Na, etc., can be included. The alkali metal element can be included in the thermoelectric conversion material of the present invention in such a form as to replace one portion of the element A.

The method for manufacturing the thermoelectric conversion material of the present invention is not particularly limited. A method for manufacturing the conventional $AMO_2$-type oxide can be applied.

More specifically, a thermoelectric conversion material in thin film form can be formed using vapor deposition methods including a sputtering method and a laser ablation method, vapor-phase growth methods including a chemical vapor deposition, or various thin film growth methods including thin film forming from a liquid phase or a solid phase. For base materials used for growing the thin film, either sapphire ($Al_2O_3$), MgO, $SrTiO_3$, $LaAlO_3$, $NdGaO_3$, $YAlO_3$, $LaSrGaO_4$, $LaSrAlO_4$, $MgAl_2O_4$, ZnO, $ZrO_2$, $TiO_2$, $Fe_2O_3$, $Cr_2O_3$, Si, GaAs, etc., which have a relatively good lattice match with the thermoelectric conversion material of the present invention, or a single crystal composed of each material, can be used.

A thermoelectric conversion material in bulk form can be formed using various methods including a solid reaction method, an ion-exchange method, a flux method, an and FZ method (floating zone method). When these methods are used, either a single-crystalline thermoelectric conversion material or a polycrystalline thermoelectric conversion material can be formed.

Hereinafter, a usage mode of the thermoelectric conversion material of the present invention will be described with reference to FIGS.

Figure 4:
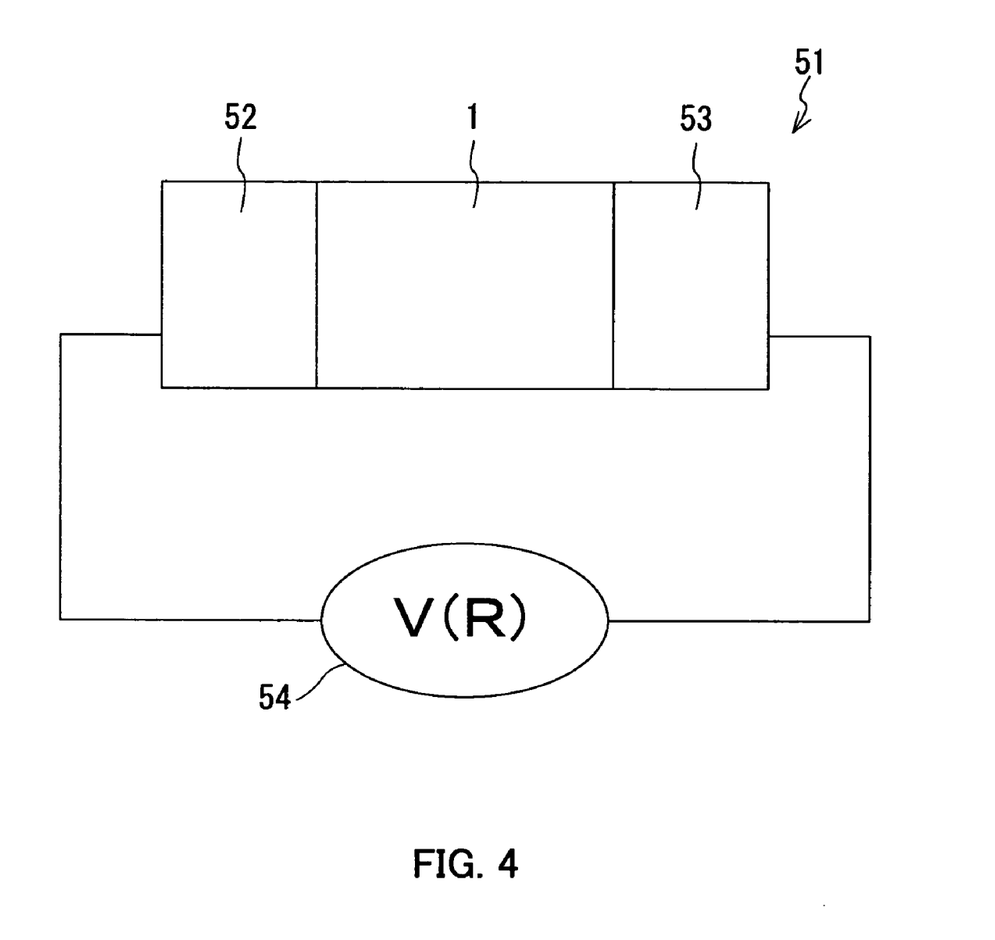
FIG. 4 is a schematic view of one example of a thermoelectric conversion element of the present invention.

As FIG. 4 shows, the simplest configuration for using the thermoelectric conversion material 1 of the present invention as a thermoelectric conversion element 51 is a configuration in which a pair of electrodes (a first electrode 52 and a second electrode 53) are connected so that the thermoelectric conversion material 1 is sandwiched therebetween.

The thermoelectric conversion element 51 can be used as a thermoelectric cooling element that uses Peltier effect when the first electrode 52 and the second electrode 53 are connected to an external DC power source (V) 54. In this case, one of the electrodes serves as a cooling portion, and the other serves as a heating portion. Lowering of the temperature of the cooling portion than that of the surrounding area allows heat to be transferred from outside (for example, an object or an environment contacting the cooling portion) to the cooling portion.

The thermoelectric conversion element 51 can be used as a thermoelectric generating element that uses Seebeck effect when the first electrode 52 and the second electrode 53 are electrically connected to an external load (R) 54. In this case, one of the electrodes is supplied with heat so that this electrode is relatively high in temperature, and the other electrode is relatively low in temperature. As a result, direct-current electricity is applied to the load 54, that is, electric power can be supplied to the load 54. Thus, the thermoelectric conversion element 51 is incorporated in a circuit including the power source or the load 54 so as to be used.

Any type of electrodes can be used as the first electrode 52 and the second electrode 53 as long as the electrodes have conductivity. Various metal materials such as copper can be used, for example.

EXAMPLES

Hereinafter, the present invention will be described in detail with reference to examples. The present invention is not limited to the following examples.

Example 1

Method of Manufacturing Samples

A method for manufacturing thermoelectric conversion material samples in Example 1 (example samples 1 to 3, comparative example samples A, B) will be described.

-Sample 1-

Using an RF magnetron sputtering method, an $Sr_{0.6}(Co_{0.5}Rh_{0.5})O_2$ thin film (sample 1) of 150 nm in thickness was formed on a sapphire substrate (C surface is exposed, 10 mm square, 1 mm in thickness). The thin film was formed under a condition that a sintered body of $Sr_{0.4}Co_{0.5}Rh_{0.5}O_2$ was used as a target, the temperature of the sapphire substrate was 650° C., an oxygen-argon mixed atmosphere (oxygen: argon (partial pressure ratio)=0.25:0.75) was 3 Pa in pressure, and the applied electric power was 30 W.

The sample 1 was evaluated for the composition by an energy dispersive fluorescent X-ray spectrometer (EDS). As a result, it was confirmed that the atomicity ratio of Sr:Co:Rh was 0.6:0.5:0.5, and the $Sr_{0.6}(Co_{0.5}Rh_{0.5})O_2$ thin film was formed as the sample 1. The same method was adopted for confirming the composition in the following samples.

Figure 5:
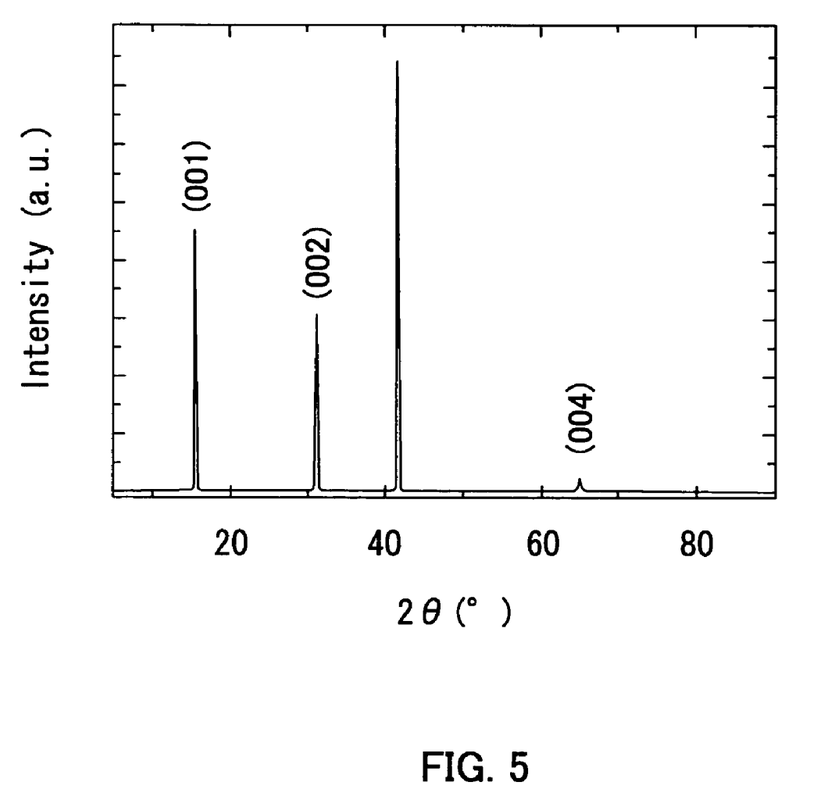
FIG. 5 is a view showing an X-ray diffraction pattern of a sample 1 manufactured in Example 1.

The sample 1 was measured by a Wide-angle X-ray Diffraction (WAXD) in a state that the sample 1 was stacked on the sapphire substrate. As a result, a diffraction profile shown in FIG. 5 was obtained. As FIG. 5 shows, a peak (diffraction angle 2θ approximately equals to 16 degrees) corresponding to a (001) surface of the sample 1, a peak (2θ approximately equals to 31 degrees) corresponding to a (002) surface of the sample 1, a peak (2θ approximately equals to 65 degrees) corresponding to a (004) surface of the sample 1, and a peak (2θ approximately equals to 42 degrees) corresponding to a C surface of the sapphire substrate were observed, thereby revealing that the sample 1 was oriented in a C axis corresponding to the crystalline structure of the sapphire substrate. In addition, the peak corresponding to each surface of the sample 1 was sufficiently acute, so that the sample 1 was expected to be high in crystallinity.

-Sample 2-

An $Sr_{0.6}(Co_{0.4}Rh_{0.6})O_2$ thin film (sample 2) of 150 nm in thickness was formed on a sapphire substrate in a similar manner to the sample 1 except for a target composition.

In a similar manner to the sample 1, the sample 2 was evaluated for the crystalline structure by WAXD. As a result, it was revealed that the sample 2 was oriented in a C axis corresponding to the crystalline structure of the sapphire substrate.

-Sample 3-

An $Sr_{0.6}(Co_{0.6}Rh_{0.4})O_2$ thin film (sample 3) of 150 nm in thickness was formed on a sapphire substrate in a similar manner to the sample 1 except for a target composition.

In a similar manner to the sample 1, the sample 3 was evaluated for the crystalline structure by WAXD. As a result, it was revealed that the sample 3 was oriented in a C axis corresponding to the crystalline structure of the sapphire substrate.

-Comparative Example Sample A-

An $Sr_{0.6}CoO_2$ thin film (sample A) of 150 nm in thickness was formed on a sapphire substrate in a similar manner to the sample 1 with the exception that a sintered body of $Sr_{0.4}CO_2$ was used as a target.

In a similar manner to the sample 1, the sample A was evaluated for the crystalline structure by WAXD. As a result, it was revealed that the sample A was oriented in a C axis corresponding to the crystalline structure of the sapphire substrate.

-Comparative Example Sample B-

An $Sr_{0.6}RhO_2$ thin film (sample B) of 150 nm in thickness was formed on a sapphire substrate in a similar manner to the sample 1 with the exception that a sintered body of $Sr_{0.4}RhO_2$ was used as a target.

In a similar manner to the sample 1, the sample B was evaluated for the crystalline structure by WAXD. As a result, it was revealed that the sample B was oriented in a C axis corresponding to the crystalline structure of the sapphire substrate.

Temperature Dependence of Electric Resistivity

Figure 6:
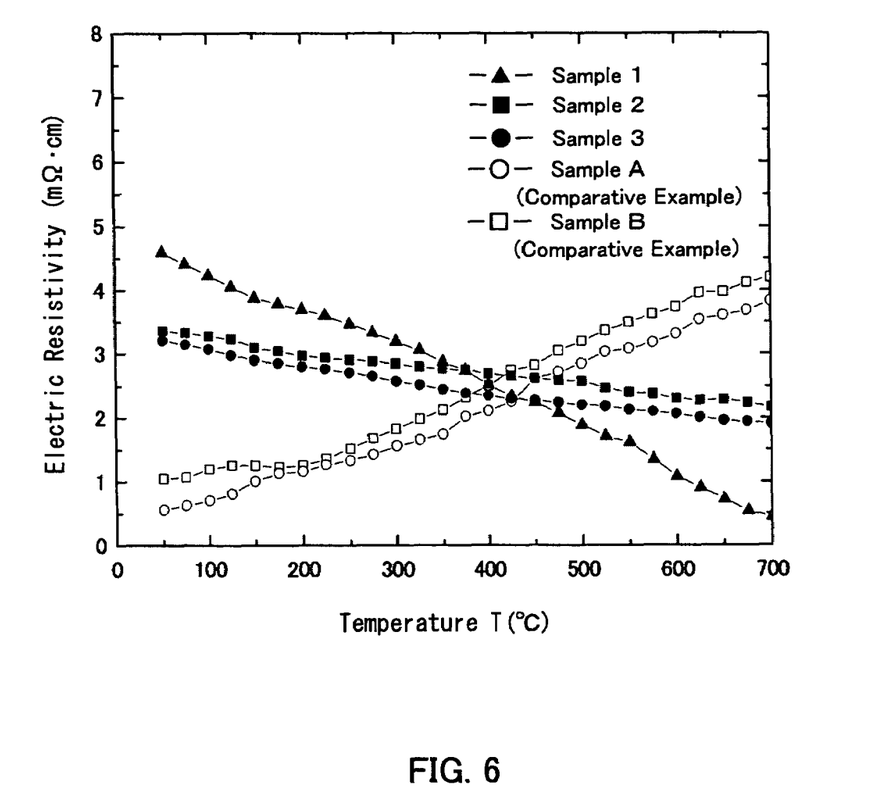
FIG. 6 is a view showing temperature dependence of electric resistivity in respective samples, as example samples and comparative example samples, manufactured in Example 1.

Each sample manufactured as above was measured for the electric resistivity by changing temperatures (each 25° C. in the range of 50 to 700° C.) so as to evaluate each sample for the temperature dependence of the electric resistivity. The evaluation results are shown in FIG. 6. It is noted that a direct current four terminal method was used for measuring each sample for the electric resistivity, and Au electrodes (400 nm in thickness) deposited on each sample by using the RF magnetron sputtering method was used for measuring-use electrodes. Wires for electrically connecting the Au electrodes and a measuring device were secured to the Au electrodes by a gold paste.

As FIG. 6 shows the electric resistivity of the comparative example samples A, B increased with increasing temperature, and showed metallic temperature dependence across the entire area of the measured temperature range. On the other hand, the electric resistivity of the example samples 1 to 3 decreased with increasing temperature, and showed semiconductor-like temperature dependence across the entire area of the measured temperature range. In other words, the samples 1 to 3 showed that values of temperature derivatives of the electric resistivity $(d\rho/dT)$ in a temperature range of 50 to 700° C. was negative. Regarding the value of the temperature derivative, the sample 1 in which about half Co was substituted with Rh (x=0.5) showed the largest negative value.

In addition, a magnitude relationship of the electric resistivity between the example samples and comparative example samples was reversed at around 400° C. While there was a difference in some samples, the electric resistivity of the example samples fell below that of the comparative example samples in a temperature range of 375 to 450° C.

(Temperature Dependence of Seebeck Coefficient)

Figure 7:
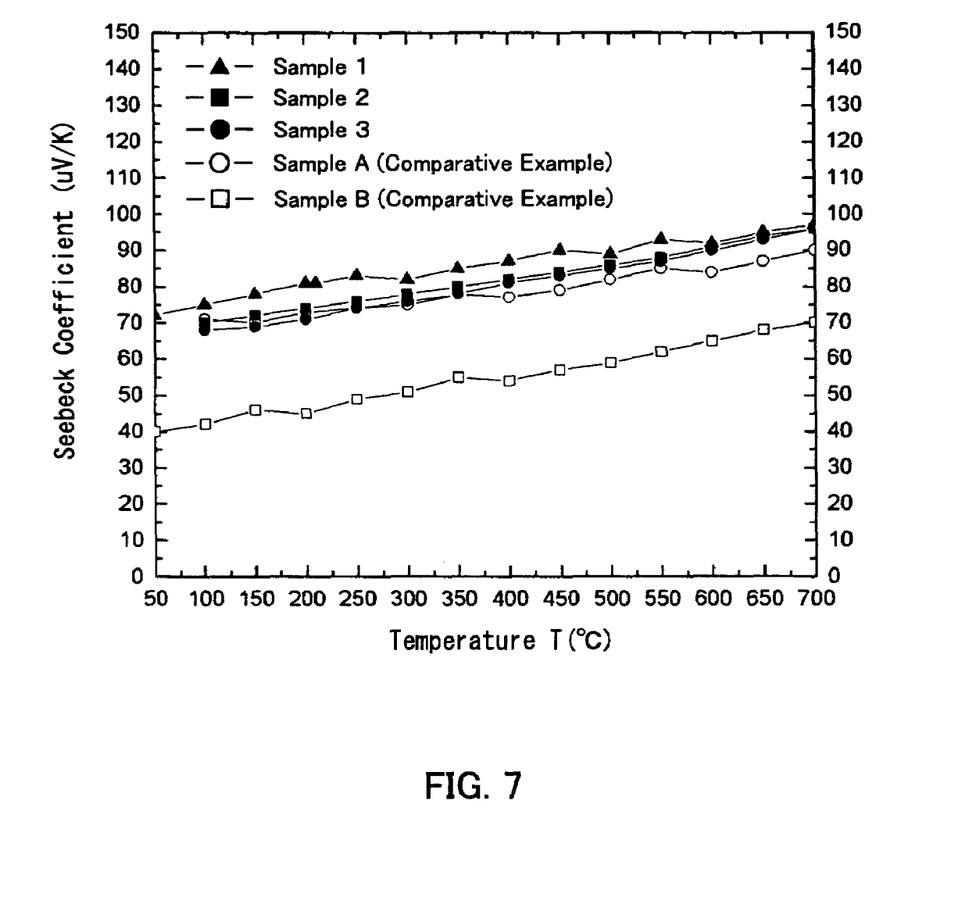
FIG. 7 is a view showing temperature dependence of Seebeck coefficients in respective samples, as example samples and comparative example samples, manufactured in Example 1.

Each sample manufactured as above was measured for the Seebeck coefficients by changing temperatures (each 50° C. in the range of 50 to 700° C. (100 to 700° C. in some samples)) so as to evaluate each sample for the temperature dependence of the Seebeck coefficient. The evaluation results are shown in FIG. 7. It is noted that a steady method was used for measuring the Seebeck coefficient after each sample was worked so as to become a shape of 1 mm×7 mm, and Au electrodes (400 nm in thickness) deposited on each sample by using the RF magnetron sputtering method was used for measuring-use electrodes.

As FIG. 7 shows, the Seebeck coefficients of the samples 1 to 3 and the sample A at around 50 to 100° C. were approximately 70 µV/K, and the Seebeck coefficient of the sample B at around 50 to 100° C. was approximately 40 µV/K. The Seebeck coefficient of each sample showed the approximately similar temperature dependence that increased with increasing temperature.

These results show that unlike the samples A, B, the samples 1 to 3 was able to decrease the electric resistivity in a high temperature range, particularly at above 400° C. and greatly improve thermoelectric performance in a wide range of temperatures, particularly at high temperature in spite of the Seebeck coefficients of the samples 1 to 3 being the same or more than those of the samples A, B.

An output factor expressed by $S^2/\rho$ at 700° C. of the sample 1 was $2\times10^{-3}$ (W/mK²), that of the sample 2 was $5\times10^{-4}$ (W/mK²), and that of the sample 3 was $5\times10^{-4}$ (W/mK²), which meant 10 times as large as that of the sample A of $2\times10^{-4}$(W/mK²), 2.5 times as large as that of the sample A, and 2.5 times as large as that of the sample A, respectively, and 20 times as large as that of the sample B of which output factor at 700° C. was $1\times10^{-4}$ (W/mK²), 5 times as large as that of the sample B, and 5 times as large as that of the sample B, respectively.

Example 2

Method for Manufacturing Samples

-Sample 4-

An $Sr_{0.3}Ca_{0.3}(Co_{0.5}Rh_{0.5})O_2$ thin film (sample 4) of 150 nm in thickness was formed on a sapphire substrate in a similar manner to the sample 1 in Example 1 with the exception that a sintered body of $Sr_{0.2}Ca_{0.2}Co_{0.5}Rh_{0.5}O_2$ was used as a target.

The formed sample 4 was evaluated for the composition by EDS. As a result, it was confirmed that the atomicity ratio of Sr:Ca:Co:Rh is 0.3:0.3:0.5:0.5, and the $Sr_{0.3}Ca_{0.3}(Co_{0.5}Rh_{0.5})O_2$ thin film was formed.

In a similar manner to the sample 1, the sample 4 was evaluated for the crystalline structure by WAXD. As a result, it was revealed that the sample 4 was oriented in a C axis corresponding to the crystalline structure of the sapphire substrate.

-Comparative Example Sample C-

An $Sr_{0.3}Ca_{0.3}CoO_2$ thin film (comparative example sample C) of 150 nm in thickness was formed on a sapphire substrate in a similar manner to the sample 1 with the exception that a sintered body of $Sr_{0.2}Ca_{0.2}CoO_2$ was used as a target.

In a similar manner to the sample 1, the sample C was evaluated for the crystalline structure by WAXD. As a result, it was revealed that the sample C was oriented in a C axis corresponding to the crystalline structure of the sapphire substrate.

-Comparative Example Sample D-

An $Sr_{0.3}Ca_{0.3}RhO_2$ thin film (comparative example sample D) of 150 nm in thickness was formed on a sapphire substrate in a similar manner to the sample 1 with the exception that a sintered body of $Sr_{0.2}Ca_{0.2}RhO_2$ was used as a target.

In a similar manner to the sample 1, the sample D was evaluated for the crystalline structure by WAXD. As a result, it was revealed that the sample D was oriented in a C axis corresponding to the crystalline structure of the sapphire substrate.

In a similar manner to Example 1, each sample was evaluated for the temperature dependence of the electric resistivity and the temperature dependence of Seebeck coefficients. As a result, the similar results of each example sample and the comparative example samples in Example 1 were obtained. For example, a magnitude relationship of the electric resistivity between the example samples and the comparative example samples was reversed at around 400° C., and the electric resistivity of the sample 4 fell below those of the comparative example samples C, D in a temperature range of about 400° C. or higher.

The output factor expressed by $S^2/\rho$ at 700° C. of the sample 4 was $4\times10^{-3}$ (W/mK$^2$), which meant 10 times as large as that of the sample C of $4\times10^{-4}$ (W/mK$^2$), and 20 times as large as that of the sample D of which output factor at 700° C. was $2\times10^{-4}$ (W/mK$^2$).

When a similar experiment was conducted on a sample group of which Sr contents are different from sample 4, and on a sample group in which Sr was completely substituted with Ca, the results similar to the above were obtained.

Example 3

In Example 3, the thermoelectric conversion material of the present invention constituted of a single crystal using a flux (fusing agent) method was manufactured.

Firstly, $SrCO_3$, $Rh_2O_3$, and $Co_3O_4$ were mixed at a molar ratio of $SrCO_3$:$Rh_2O_3$:$Co_3O_4$ to 6:3:2. Subsequently, nine times the mass of $SrCl_2$, $CoCl_2$, $RhCl_2$, and KCl (or $K_2CO_3$+KCl in place of KCl) (molar ratio of $SrCl_2$:$CoCl$:$RhCl_2$:KCl (or $K_2CO_3$+KCl) to 1:1:1:2) were further added as a flux (fusing agent) relative to the sum of $SrCO_3$, $Rh_2O_3$, and $Co_3O_4$. Subsequently, the whole was mixed.

Next, the obtained mixture was heated (at 800° C.) in an electric furnace under an air atmosphere so that the entire mixture was melted. The melted mixture was subsequently gradually cooled to 600° C. at a decreasing temperature rate of 1.5K/hour, and was further cooled to room temperature at a decreasing temperature rate of 100K/hour.

Next, the flux was removed by using distilled water so as to form an $Sr_{0.6}(Co_{0.5}Rh_{0.5})O_2$ single crystal (sample 5).

The formed sample 5 was evaluated for the composition by EDS. As a result, it was confirmed that the atomicity ratio of Sr:Co:Rh is 0.6:0.5:0.5, and the $Sr_{0.6}(Co_{0.5}Rh_{0.5})O_2$ single crystal was formed as the sample 5.

Besides the manufacturing of the sample 5, an $Sr_{0.6}CO_2$ single crystal (sample E) was formed in a similar manner to the sample 5 with the exception that $Rh_2O_3$ and $RhCl_2$ were not used, and $SrCO_3$ and $Co_3O_4$ were mixed in a molar ratio of $SrCO_3$:$Co_3O_4$ to 3:2.

Furthermore, besides the manufacturing of the samples 5, and E, an $Sr_{0.6}RhO_2$ single crystal (sample F) was formed in a similar manner to the sample 5 with the exception that $Co_3O_4$ and $CoCl_2$ were not used, and $SrCO_3$ and $Rh_2O_3$ were mixed in a molar ratio of $SrCO_3$:$Rh_2O_3$ to 1:1.

Each sample manufactured as above was evaluated for the temperature dependence of the electric resistivity and the temperature dependence of Seebeck coefficients in a similar manner to Example 1. As a result, the similar results of the respective example sample and the comparative example samples in Example 1 were obtained. For example, a magnitude relationship of the electric resistivity between the example samples and the comparative example samples was reversed at around 400° C., and the electric resistivity of the sample 5 fell below those of the comparative example samples E and F in a temperature range of about 400° C. or higher.

An output factor expressed by $S^2/\rho$ at 700° C. of the sample 5 was $4\times10^{-3}$ (W/mK$^2$), which means 8 times as large as that of the sample E of $5\times10^{-4}$ (W/mK$^2$), and 20 times as large as that of the sample F of which output factor at 700° C. was $2\times10^{-4}$ (W/mK$^2$).

As described above, according to the present invention, it is possible to provide a thermoelectric conversion material having semiconductor-like properties, that is, the property that electric resistivity decreases with increasing temperature, and having high thermoelectric performance.

The thermoelectric conversion material of the present invention exhibits good thermoelectric performance in a wide range of temperatures from 50 to 700° C. While there is no temperature limit to the thermoelectric conversion material of the present invention, it is particularly suitable for the use at high temperature for cogeneration, for example. It is particularly suitable for the use at high temperature when one portion of the thermoelectric conversion material is heated to about 400 to 700° C.

As many apparently widely different examples of this invention may be made without departing from the spirit and scope thereof, it is to be understood that the invention is not limited to the specific examples thereof except as defined in the appended claims.

What is claimed is:

1. A thermoelectric conversion material including a semiconductor phase having a layered bronze structure expressed by a formula of $A_y(Co_{1-x}Rh_x)O_2$, where A is an alkaline-earth metal, y is 0.2 to 0.8, and x is 0.4 to 0.6.

2. The thermoelectric conversion material according to claim 1, wherein A is at least one element selected from calcium (Ca), and strontium (Sr).

3. The thermoelectric conversion material according to claim 1, made of a crystal expressed by the formula of $A_y(Co_{1-x}Rh_x)O_2$.

4. The thermoelectric conversion material according to claim 1, wherein a temperature derivative ($d\rho/dT$) of electric resistivity at 300° C. is negative.

5. The thermoelectric conversion material according to claim 4, wherein a temperature derivative ($d\rho/dT$) of electric resistivity at 300° C. is −0.006 or less.

6. A thermoelectric conversion element comprising the thermoelectric conversion material according to claim 1, and a pair of electrodes connected to the thermoelectric conversion material.

7. An electronic apparatus comprising the thermoelectric conversion element according to claim 6, and a load electrically connected to the thermoelectric conversion element and operated by power supplied from the thermoelectric conversion element.

8. A cooling device comprising the thermoelectric conversion element according to claim 6, and a power source electrically connected to the thermoelectric conversion element.

* * * * *